United States Patent
Hemming et al.

(10) Patent No.: US 6,859,047 B2
(45) Date of Patent: Feb. 22, 2005

(54) ANECHOIC TEST CHAMBER AND METHOD OF DETERMINING A LOSS CHARACTERISTIC OF A MATERIAL SPECIMEN

(75) Inventors: Leland H. Hemming, Mesa, AZ (US); Charles P. Leonard, Mesa, AZ (US)

(73) Assignee: The Boeing Company, Chicago, IL (US)

( * ) Notice: Subject to any disclaimer, the term of this patent is extended or adjusted under 35 U.S.C. 154(b) by 65 days.

(21) Appl. No.: 10/273,913

(22) Filed: Oct. 18, 2002

(65) Prior Publication Data

US 2004/0075443 A1 Apr. 22, 2004

(51) Int. Cl.$^7$ ............................................. G01R 27/26
(52) U.S. Cl. ..................................... 324/637; 324/639
(58) Field of Search ................................. 324/637, 646, 324/627, 628, 639; 342/1, 4; 343/703

(56) References Cited

U.S. PATENT DOCUMENTS

| | | | |
|---|---|---|---|
| 4,496,950 A | 1/1985 | Hemming et al. | 342/4 |
| 4,507,660 A | 3/1985 | Hemming | 342/1 |
| 4,977,296 A | 12/1990 | Hemming | 174/35 MS |
| 5,039,949 A | 8/1991 | Hemming et al. | 324/646 |
| 5,285,164 A | 2/1994 | Wong | 324/628 |
| 5,428,360 A * | 6/1995 | Tam et al. | 342/165 |
| 5,631,661 A | 5/1997 | Sanchez | 343/703 |
| 5,757,194 A | 5/1998 | Yun | 324/627 |
| 6,057,796 A * | 5/2000 | Kotsuka | 342/1 |
| 6,127,980 A * | 10/2000 | Podgorski | 343/703 |
| 6,295,032 B1 | 9/2001 | Podgorski | 343/703 |

OTHER PUBLICATIONS

Agilent Technologies, Inc., "Agilent Specifying Calibration Standards for the Agilent 8510 Network Analyzer, Product Note 8510–5B", 2001 Agilent Technologies, Inc., Printed in USA Sep. 21, 2001, 5956–4352.

Agilent Technologies, Inc., "Agilent 8510C Network Analyzer, Data Sheet", 1999, 2000 Agilent Technologies, Inc., Printed in USA 6/00, 5091–8484E.

Hickman and Lyon, "Experimental Evaluation of the Massachusetts Institute of Technology Lincoln Laboratory Anechoic Chamber", Scientific–Atlanta, Inc., Atlanta, Georgia, Jun. 1968.

* cited by examiner

Primary Examiner—N. Le
Assistant Examiner—John Teresinski
(74) Attorney, Agent, or Firm—Alston & Bird LLP

(57) ABSTRACT

An anechoic test chamber for testing an electromagnetic loss characteristic of a material specimen has first and second opposed and tapered conical sections. The chamber has an anechoic material covering its inside surface. Feed and receive antennas are disposed on the ends of the conical sections. An aperture plate is disposed between the first and second sections. The aperture plate electromagnetically isolates the first and second conical sections except for the aperture itself. A method of determining an electromagnetic loss characteristic of a material specimen utilizes a dual tapered conical chamber for processing S-parameter measurements to determine impedance, complex permittivity, or complex permeability of the specimen.

25 Claims, 5 Drawing Sheets

ANECHOIC TEST CHAMBER AND METHOD OF DETERMINING A LOSS CHARACTERISTIC OF A MATERIAL SPECIMEN

FIELD OF THE INVENTION

The present inventions relate to anechoic test chambers and methods of determining material specimen characteristics in an anechoic test chamber, and, more particularly, to a dual tapered conical anechoic test chamber and a method of determining a loss characteristic of a material specimen in a dual tapered conical anechoic test chamber with tapered ends.

BACKGROUND OF THE INVENTION

Anechoic test chambers are used for conducting electromagnetic analyses. One use of an anechoic chamber includes testing loss or impedance properties of a material specimen. Loss properties that are often determined include impedance, permittivity, permeability, complex permittivity, and complex permeability. For example, S-parameter microwave analysis techniques are used to examine the changes in field strength, phase difference, and polarization effects of an electromagnetic wave propagated through a material specimen. From these analyses, the loss parameters are determined.

These techniques are used in many industries. The aerospace industry, for example, tests the loss characteristics of aircraft materials. In some cases, honeycomb structural composite materials are doped with electromagnetic attenuating material so that they have high loss characteristics. These characteristics may be used to define parameters for controlling radar cross sections.

The measurement of large sheet materials has been limited to microwave frequencies due to a lack of test apparatus that could properly illuminate the materials with a uniform electromagnetic wave in a confined space at lower frequencies. At lower frequencies, uniform electromagnetic fields are typically accomplished with waveguides. Thus, a material specimen is placed within the waveguide for the analysis to take place. As such, the material specimen must be cut for insertion. That is to say that these are destructive tests, the sample is cut in order to be precisely fitted into the waveguide and otherwise destroyed and unusable for manufacture after these lower frequency tests.

Anechoic test chambers are generally used for testing antennas that are terminated into a back wall. These anechoic chambers have not, however, been effective for low frequency material specimen testing due to the longer wavelengths at low frequencies. The longer wavelengths pose a problem of controlling a uniform field at the material specimen.

Therefore, what is needed is an anechoic test chamber that works down to sub-microwave frequencies. Such an anechoic test chamber may permit insertion of large samples without destruction. The test system should be capable of controlling a uniform electromagnetic field about the specimen.

BRIEF SUMMARY OF THE INVENTION

An anechoic test chamber for testing an electromagnetic loss characteristic of a material specimen is provided. One embodiment of an anechoic test chamber comprises first and second opposed conical sections. First and second conical sections taper inwardly and away from each other along a common longitudinal axis. Each conical section has an anechoic material covering its inside surface. A first antenna is disposed on the end of the first conical section and a second antenna is disposed on the end of the second conical section. The first and second antennas may be feed and receive antennas, respectively. An aperture plate is disposed between the first and second sections. In order to electromagnetically isolate the first and second conical sections except for the aperture and material specimen, the aperture plate has an electromagnetic impedance lower than that of the material specimen.

According to one aspect of an anechoic test chamber the inside surface of the first conical section has an intersection angle such that an electromagnetic wave reflected from the inside surface arrives at the aperture in phase with a direct path component of the electromagnetic wave. This intersection angle may be dependent upon a predetermined wavelength and path length from the feed antenna to the aperture.

According to another aspect of an anechoic test chamber, the chamber may further comprise a cylindrical section having an anechoic interior covering. The cylindrical section is disposed between the first and second conical sections and holds the aperture plate. As such, the cylindrical section permits rotation of the aperture plate to an angle between the first and second sections.

One aspect of an anechoic chamber may comprise first and second conical sections being disposed at an angle with respect to horizontal. As such, the cylinder and aperture plate permit the specimen to rest against the aperture plate, even when the aperture plate is perpendicular to the electromagnetic wave propagation path. Other aspects of the aperture may include electromagnetic attenuating tape for sealing the specimen and the aperture plate. As such, the tape should have a low electromagnetic impedance, i.e. highly conductive.

According to one embodiment of an anechoic test chamber, the first and second conical sections comprise first and second modular cones capable of being removably connected to each other. As such, antennas can be interchanged through the use of different modular cones. Different types of antennas that may be interchanged include printed circuit flared notch antenna, a conical quadridged horn antenna, and a quadridged diagonal antenna.

Also provided is a method of determining a loss characteristic of a material specimen in a dual conical anechoic test chamber having an aperture plate. One embodiment of the method comprises calibrating the measurement system. The material specimen is then placed over the aperture plate at a first angle with respect to the longitudinal axes of the conical sections. The intersection between the specimen and the aperture plate is covered with an electromagnetic attenuating material. A first electromagnetic wave is transmitted from the first conical section through the specimen at a predetermined frequency and field intensity. The first electromagnetic wave is measured in the second conical section, and a loss characteristic of the specimen is determined based on the difference between the transmitted and measured electromagnetic wave.

According to one aspect of a method for determining a loss characteristic of a material specimen, the step of calibrating the measurement system comprises transmitting a first calibration electromagnetic wave from the first conical section at the predetermined frequency, magnitude, and polarization through the aperture plate. The first calibration wave is measured in the second conical section and a first calibration parameter is determined based on a difference between the transmitted and measured first electromagnetic wave. The aperture is then covered with an electromagnetically reflective material and a second calibration electromagnetic wave is transmitted from the first conical section at the predetermined frequency, magnitude, and polarization through the covered aperture plate. The second calibration wave is measured in the second conical section, and a second calibration parameter is determined based on a difference between the transmitted and measured second electromagnetic wave.

According to another aspect of a method for determining the loss characteristic of a material specimen, the method may further comprise rotating the specimen to a second angle and repeating the transmitting, measuring, and determining steps. Other aspects of the method may include transmitting an electromagnetic wave at the predetermined frequency and field intensity and a second polarization, and then repeating the transmitting, measuring, and determining steps. Another aspect of the method includes altering the thickness of the material specimen and then repeating the transmitting, measuring, and determining steps. The step of altering the thickness of the specimen may comprise doubling the thickness of the material specimen. Alternatively, the method may comprise covering the aperture with electromagnetically reflective material such that the specimen lies between the reflective material and the feed antenna, and then repeating the transmitting, measuring, determining steps. As such, the determining steps may then permit determining one or more loss parameters including impedance, permittivity, permeability, complex permittivity, and complex permeability. According to one aspect of the method the loss parameters may be determined from S-parameter electromagnetic wave propagation analysis.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figures 1A, 1B:
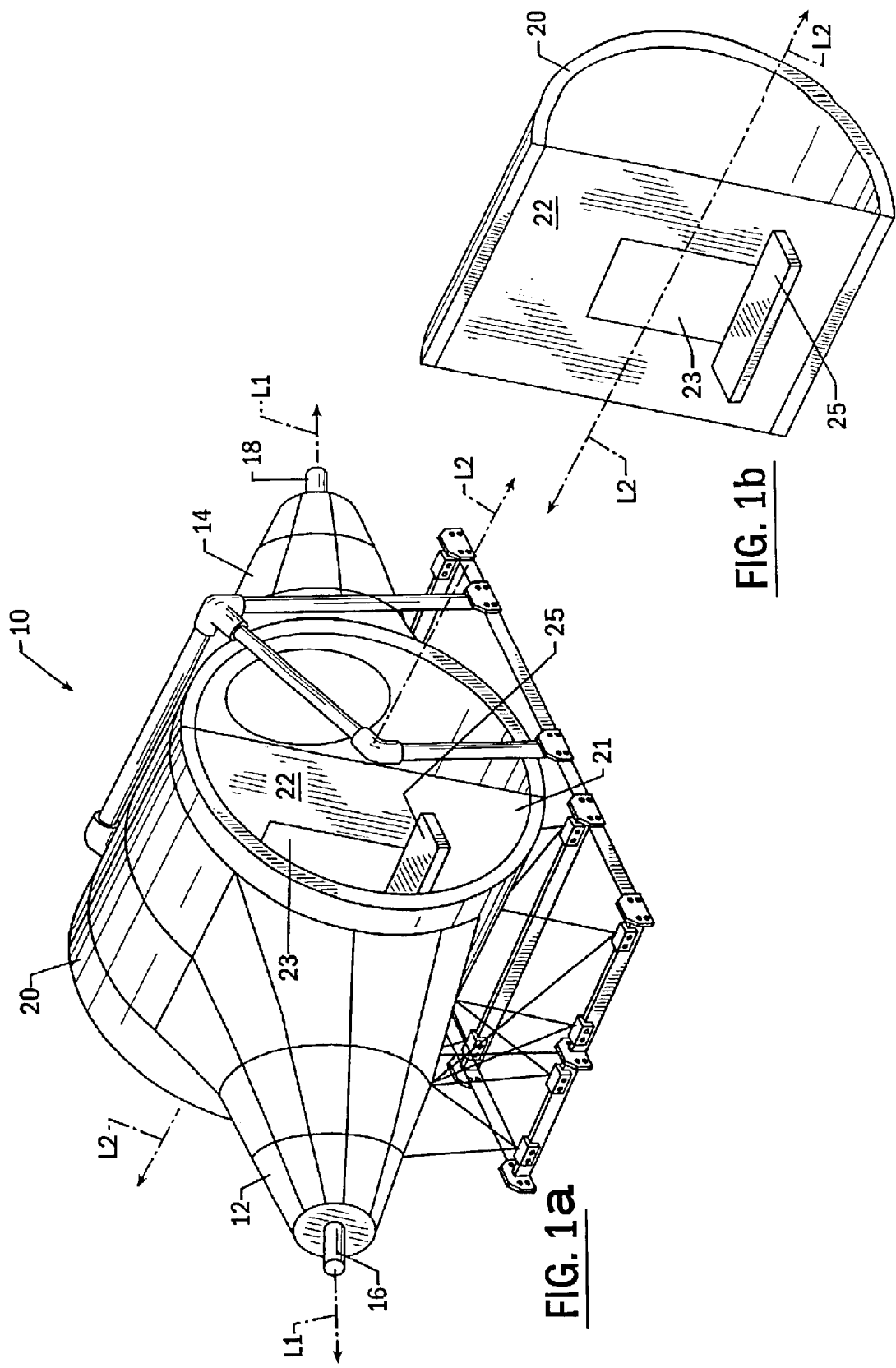
FIGS. 1a and 1b are perspective views of an anechoic test chamber illustrating the interior of the cylinder and aperture plate according to one embodiment of the present invention.

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Referring to FIGS. 1 through 5, one embodiment of an anechoic test chamber 10 comprises a dual taper conical anechoic electromagnetic test chamber 10. A first conical section 12 houses a first antenna 16. A second conical section 14 houses a second antenna 18. The first and second antennas 16, 18 may be feed and receive antennas, respectively. The feed antenna provides an electromagnetic wave incident upon a test sample placed between the feed and receive antennas. The receive antenna, therefore, receives the electromagnetic wave minus any loss associated with the transmission through the material. Some measurements will also include reflected measurements, discussed in more detail below, wherein the first antenna may be both a feed and receive antenna.

Figure 4:
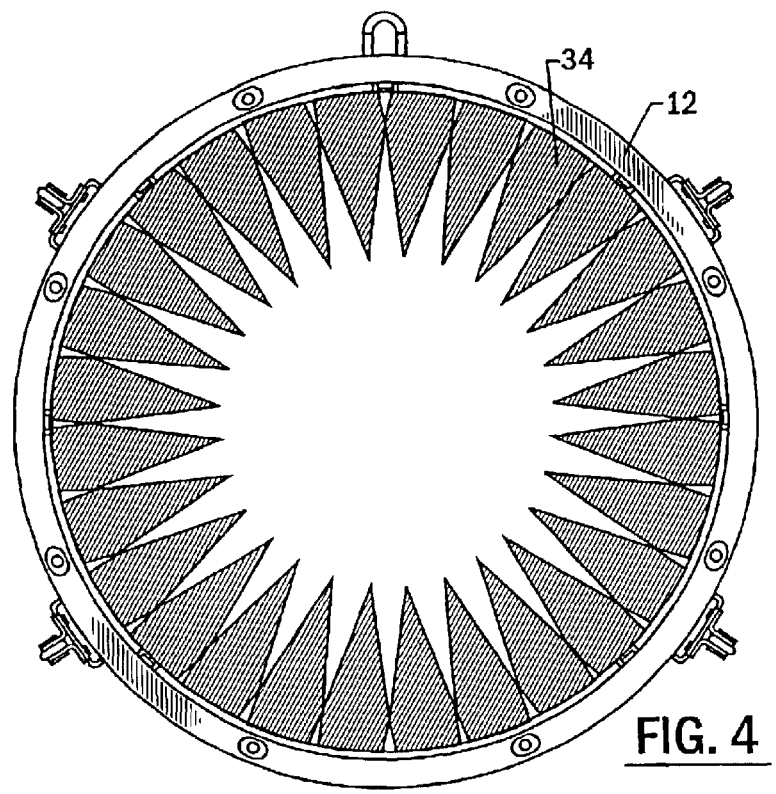
FIG. 4 is a cross section of a first conical section of an anechoic test chamber according to one embodiment of the present invention.
Figure 5:
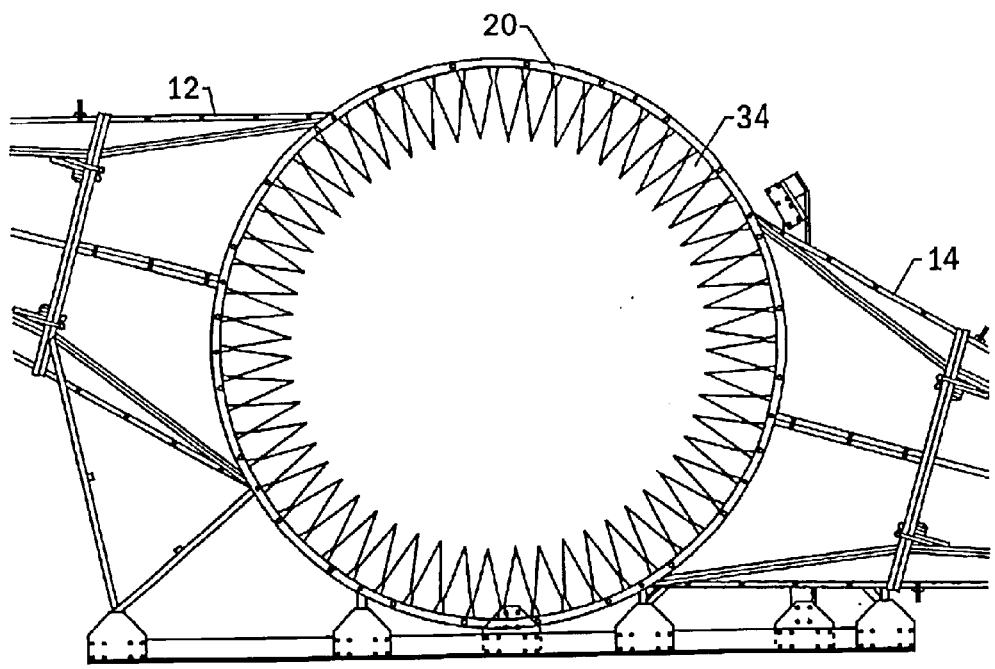
FIG. 5 is a cross section of a cylinder of an anechoic test chamber according to one embodiment of the present invention.

First and second longitudinal axes of the first and second conical sections 12, 14, respectively, are collinear. As such, first and second conical sections both lie along a common longitudinal axis L1 so that first and second conical sections 12, 14 taper inwardly and away from each other. The first and second antennas 16, 18 are directed along the common longitudinal axis L1. The conical sections are constructed of aluminum or other highly reflective material. Referring to FIG. 4, a cross section of the first conical section, first and second conical sections 12, 14 have an interior surface covered with an anechoic radio frequency (RF) absorbing material 34, such as wedge shaped conductive carbon loaded foam material. One example of a suitable RF absorbing material and various configurations thereof are found in U.S. Pat. No. 4,496,950 to Hemming et al., which is hereby incorporated by reference.

According to this embodiment, a cylinder 20 lies between the conical sections. The cylinder 20 has a longitudinal axis L2 perpendicular to the longitudinal axis L1 of the first and second conical sections 12, 14. The diameter of the cylinder 20 should be chosen to be at least the largest diameter of the conical sections 12, 14, or larger, to permit joining the cylinder 20 to the conical sections 12, 14. The cylinder 20 has a door 24 on one end for inserting and placing a material to be tested therein. The interior of the cylinder 20 is also covered with an anechoic material 34, such as pyramidal shaped anechoic material comprised of conductive carbon loaded foam. This anechoic material 34 may be mounted using removable fasteners, such as VELCRO™. Removable fasteners permit the anechoic material to be replaced while changing the angle of an aperture plate 22, as discussed below.

Within the cylinder 20 is the aperture plate 22, best seen in a cut away view in FIG. 1b, which illustrates only half of the cylinder 20 and aperture plate 22. The aperture plate 22 provides an aperture 23 through which the electromagnetic wave propagates from the first antenna 16 to the second conical section 14 and the second antenna 18. The aperture 23 size and shape may be selected corresponding to a desired size and shape of a test material through which the electromagnetic wave will propagate and be measured. Accordingly, field measurements at various places about the aperture plate 22, discussed below, will also aid one of ordinary skill in the art to select the size and shape of the aperture 23. The aperture plate 22 is a high loss material that shields electromagnetic wave propagation. The aperture plate 22 material may be made from highly conductive material such as aluminum or other similar high loss material.

In this embodiment the cylinder 20 permits the angle of incidence of the incoming wave to be adjustable. As previously described, the first and second antennas 16, 18 are directed along the common longitudinal axis L1 of the first and second conical sections 12, 14, respectively. The aperture plate 22 is therefore set at an angle with respect to the common longitudinal axis L1 of the first and second conical sections 12, 14. The cylinder 20, therefore, permits the aperture plate 22 to be placed against landings or on a fixture that permits movement of the aperture plate 22 through a range of angles within the cylinder 20. The aperture plate 22 may be rotated to permit various angles with respect to the common longitudinal axis L1 of the first and second conical sections 12, 14. As such, rotating the aperture within the cylinder alters the angle of incidence of an electromagnetic wave from the feed antenna. According to this embodiment, the aperture plate 22 permits a rotation range of at least 45 degrees from a nominal zero degree test position centered about the longitudinal axis L2 of the cylinder 20 to permit a range of angles with respect to the longitudinal axis L1 of the conical sections 12, 14.

The cylinder 20 of this embodiment therefore permits rotation of the aperture plate 22 within the test chamber 10, however, the aperture plate 22 may be supported by devices other than a cylinder and need not be cylindrical. In fact, other embodiments of a test chamber will not include measurements that require rotation of the aperture plate, and therefore the aperture plate may be fixed in any manner between the first and second cylinders so long as the embodiment does not change the basic function of the aperture plate or the chamber.

Figure 2:
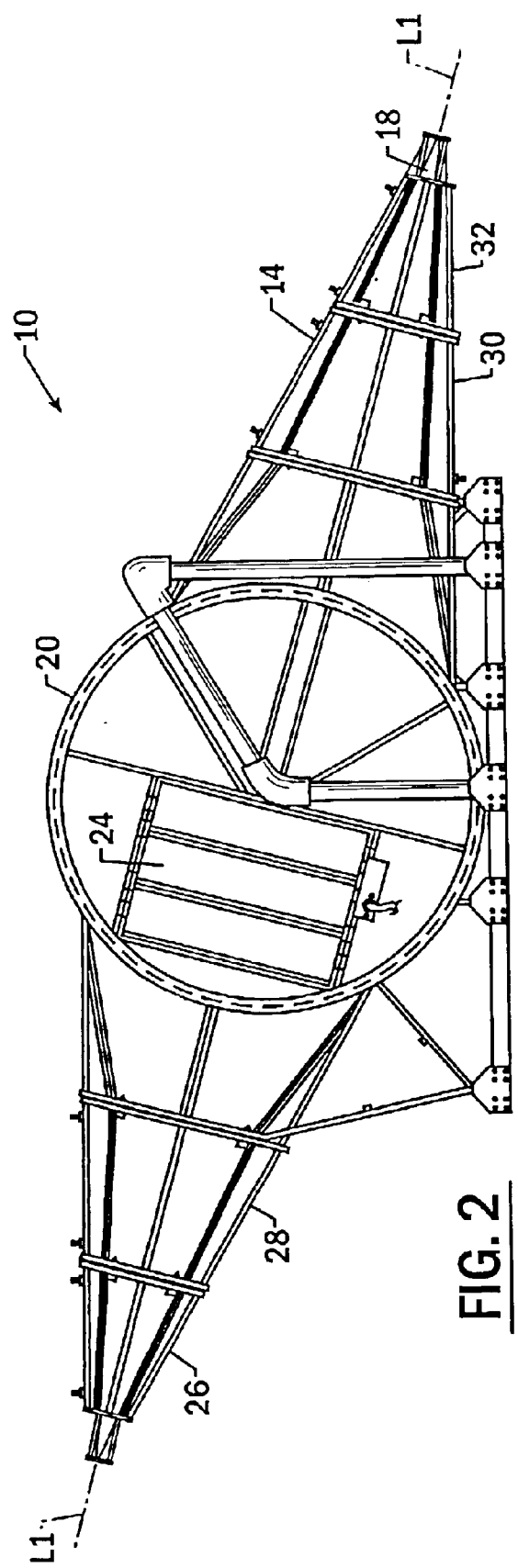
FIG. 2 is a side view of an anechoic test chamber according to one embodiment of the present invention.
Figure 3:
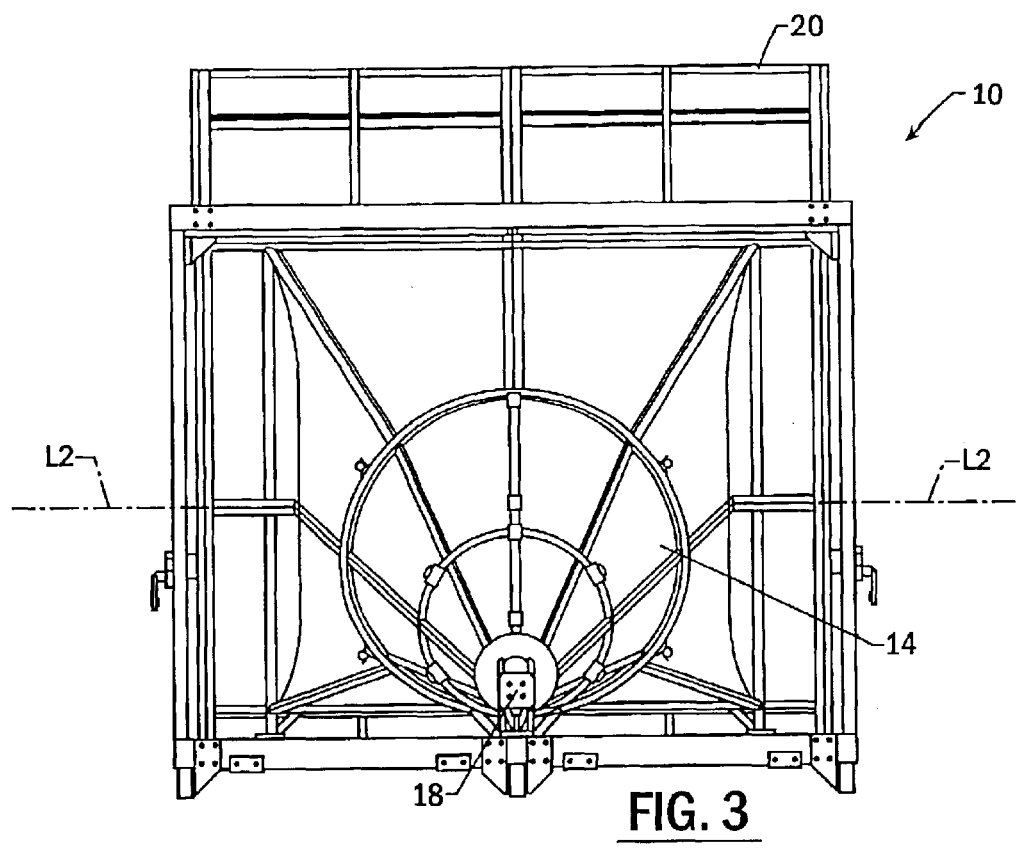
FIG. 3 is an end view of an anechoic test chamber according to one embodiment of the present invention.

Another feature of this embodiment of the anechoic test chamber 10 includes a tilt from horizontal of the common longitudinal axis L1 of the first and second conical sections 12, 14. For example, FIGS. 1 and 2 illustrate a longitudinal axis L1 tilt of 15 degrees from horizontal. As can be seen, this angular tilt permits a material specimen to be placed against the aperture plate 22 for an electromagnetic wave incidence of 90 degrees without requiring that the sample be otherwise secured in the cylinder 20. That is to say that the material specimen may gravitationally rest against the aperture plate 22, while the aperture plate is perpendicular to the longitudinal axis of the conical sections 12, 14 due to the tilt with respect to horizontal. As can be seen in FIG. 1, shelving 25, landings, or other support fixtures may be supplied for allowing the specimen to rest against the aperture plate 22.

The first and second conical sections 12, 14 housing the first and second antennas 16, 18 are designed so that the direct path and reflected path of an electromagnetic wave arrive in-phase at the material specimen. In effect, an antenna and its images form a virtual antenna array whose element separation over the frequency band is such that a single main lobe illuminates the test aperture. As seen in FIG. 4, the first and second conical sections 12, 14 are lined with anechoic material 34. The anechoic material, therefore, provides a lossy characteristic and alternates reflections within the chamber, thus broadbanding the test measurements. The first and second antennas 16, 18 are isolated from each other by the aperture plate 22, set at the desired angle of incidence, and then electromagnetically sealed around the perimeter of the aperture plate with conductive RF shielding tape such as copper foil shielding tape, 3M Part No. 1181 available from Minnesota Mining and Manufacturing, Electrical Products Division, Austin, Tex. As seen in cross section in FIG. 5, the interior of the cylinder 20 is also lined with anechoic material 34 so that reflected energy is terminated.

Figure 6:
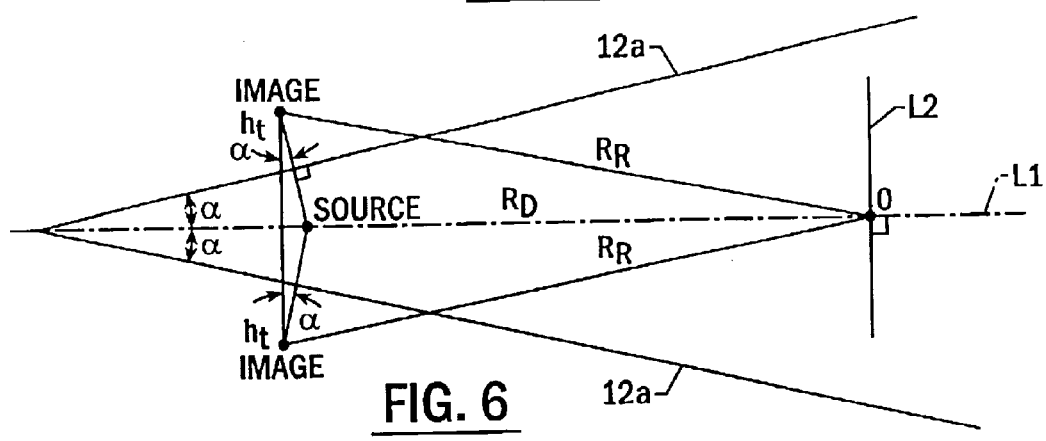
FIGS. 6 and 7 are line diagrams illustrating electromagnetic propagation paths in an anechoic chamber according to one embodiment of the present invention.

Referring to FIG. 6, the angle of intersection of the conical sections is 2α and is selected according to a desired image height, $h_i$, so that reflection path, $R_R$, from the interior sidewalls 12a of the first conical section, and direct path, $R_D$, arrive in phase at the center of the test aperture, O, which lies at the intersection of the longitudinal axes L1 and L2 of the first and second conical sections 12, 14 and the cylinder 20, respectively. For purposes of explanation, only first bounce paths are described and analyzed, as higher order bounce paths have a much nearer normal incidence, which attenuates the wave significantly. As is illustrated, a tapered conical sidewall 12a permits symmetrical images of the feed antenna to be reflected toward the aperture thus defining a virtual antenna array. The reflected paths will arrive in phase at the aperture plate when:

$$R_R = R_D + \frac{N\lambda}{2} \quad \text{where } N = 1, 3, 5, 7, \text{ etc.} \quad \text{(Equation 1)}$$

The reflected paths provide the broadest and most uniform single side lobe when N=1. As such, the trigonometric relationships of the path lengths define the angle of intersection between the source or feed antenna and a line drawn perpendicular to the longitudinal axis. As such, the angle of intersection of the cones, 2α, may be selected according to the desired wavelength or frequency to be tested. For a particular frequency, the phase center of the antenna should be mounted in the conical sections 12, 14 such that the distance from a sidewall 12a to the phase center of the antenna is less than approximately one wavelength.

The images permit the analysis of the direct and reflected path wave in terms of the direct path field. For example, referring to FIG. 7, the propagation paths $R_D$, $R_{R2}$, $R_{R1}$ of the feed antenna, labeled source, comprise a direct path transmission, $R_D$, and bounce path transmissions, $R_{R2}$, $R_{R1}$, from the sidewall 12a of the conical section. Referring once again to FIG. 4, it is known that the relationship for the field at any arbitrary point, P, about the aperture is $$E(P) = E_D\left[e^{-\frac{j2\pi R_D}{\lambda}} + C_1\left(\frac{R_D}{R_{R1}}e^{-\frac{j2\pi R_{R1}}{\lambda}} + \frac{R_D}{R_{R2}}e^{-\frac{j2\pi R_{R2}}{\lambda}}\right) + 2C_2\frac{R_D}{R_o}e^{-\frac{j2\pi R_o}{\lambda}}\right] \quad \text{(Equation 2)}$$

where $E_D$ is the direct field strength;

$R_D$ is the direct path length;

$R_{R1}$ and $R_{R2}$ are the reflected path lengths;

$R_o$ is the nominal reflected path length to the center of the aperture;

$C_1$ and $C_2$ represent reflection coefficients for the chamber sidewalls 12a, with the magnitude of the constants $C_1$ and $C_2$ being determined experimentally from data as a function of the angle of incidence; and the phases for the two constants are assumed to be π radians due to low grazing angles.

Figure 7:
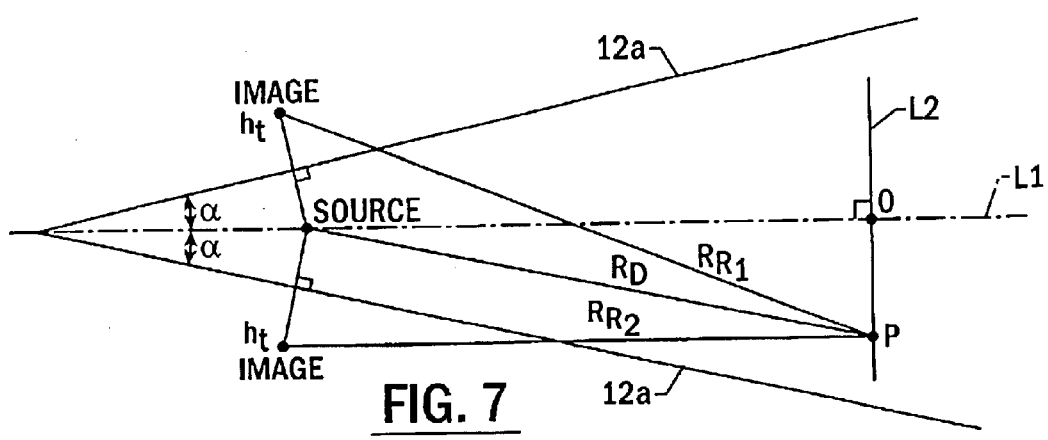

As described by the equations and FIGS. 6 and 7, a dual tapered conical test chamber 10 provides a virtual image of a ring radiator about the feed or source antenna, and the virtual image of the antenna and the direct transmission path arrive in phase at the test aperture. The use of dual tapered conical chamber also causes the field illuminating the test aperture to be relatively uniform in amplitude. The uniform illumination of the material under test approximates open field test conditions, which therefore permits a simulation of open field test conditions in the laboratory.

According to one embodiment of an anechoic test chamber 10, the antennas used to feed the conical sections from 0.125 to 2.0 GHz are printed circuit flared notch antennas arranged so that both vertical and horizontal polarization can be selected. Conical quadridged horns are used from 2 to 18 GHz. Quadridged diagonal antennas are used from 18 to 40 GHz. The antennas are dual polarized so an electromagnetic wave may be provided that is horizontal to the plane, horizontal to the ground or vertical with respect to the ground.

One embodiment of the anechoic test chamber 10 also includes first and second conical sections 12, 14 that comprise removable modular cones 26, 28, 30, 32. The modular cones 26, 28, 30, 32 permit expanding or contracting the length of the conical sections for different frequency range measurements. As such, one modular cone is removed from a conical section to permit a different antenna to be inserted at a different range from the test aperture. For a higher frequency antenna the range from the test aperture will be larger and the resultant distance to the sidewall will be shorter based on those selected angles and paths lengths discussed above.

According to one embodiment of a method for determining a loss characteristic of a material specimen, a dual conical anechoic test chamber 10, such as an embodiment described above, is used to propagate an electromagnetic wave from a feed antenna through a material specimen. The anechoic test chamber will include feed and receive antennas, which supply measurement data to a network analyzer. One specific embodiment of the method for determining the loss characteristics of a material specimen includes inserting a material specimen into the cylinder 20 over the aperture plate 22 such that the material specimen is aligned with the aperture. After placing the sample over the aperture, an electromagnetic wave of a known frequency, intensity, phase and polarization is transmitted from the first conical section 12 through the material and aperture. The receiving antenna therefore, receives the attenuated electromagnetic wave to provide measurement data to a network analyzer. The network analyzer compares the electromagnetic wave transmitted from the feed antenna to the electromagnetic wave received at the receive antenna. The network analyzer uses any one of various electromagnetic wave analysis techniques to determine the loss characteristics of the material specimen from the difference between the received and transmitted electromagnetic wave.

It has been found that the best results are obtained when the dynamic range of the measurement is in excess of 40 dB for high loss materials. Therefore to ensure that accurate transmission measurements are achieved, there should be a high degree of electromagnetic isolation between the two sides of the aperture plate 22, and typically about 60 dB or greater. At the intersection 21 of the aperture plate 22 and the cylinder 20, there may be some areas of incomplete overlap and that intersection area should be electromagnetically sealed. One method of electromagnetically sealing these intersections to obtain a high degree of isolation is to use conductive sealing tape, such as a copper conductive tape. Electromagnetic sealing and shielding between elements and examples of acceptable electromagnetic attenuating tape are described in U.S. Pat. No. 4,977,296 to Hemming, which is hereby incorporated by reference.

The foregoing methods may be implemented by analyzing the wave propagation through the material specimen using S-parameter analysis. S-parameter analysis techniques may be accomplished by a variety of commercially available broadband network analyzers, such as the Agilent 8510 Network Analyzer manufactured by Agilent Technologies, Inc. of Palo Alto, Calif., and analysis software such as 85071D Materials Measurement Software also available from Agilent Technologies.

Impedance, permittivity, permeability, complex permittivity, and complex permeability of a material can be measured using S-parameter analysis, such as described in Agilent AN 154 S-parameter Design Application Note, which is hereby incorporated by reference. As S-parameters relate ratios of RF network inputs to outputs, they can be used to measure the ratios of RF network inputs and outputs for a material placed within an anechoic test chamber and tested by an incident RF electromagnetic wave. For example, $S_{11}$ is a reflection measurement off the face of a sheet of material. $S_{12}$ is a transmission measurement through a sheet of material. As such, $S_{11}$ and $S_{12}$ may be measured as a ratio of the electromagnetic waves from the feed and receive antennas, and measured in terms of magnitude and phase.

For $S_{11}$, the reflection measurement, the first antenna 16 may be used as a feed and receive antenna. An electromagnetic wave is propagated and is incident to the material specimen at a first angle. The reflected electromagnetic wave may be received by the first antenna 16 and provided to a network analyzer for determination of $S_{11}$. The propagation of the electromagnetic wave through the material specimen may be received by the second antenna 18 and similarly provided to a network analyzer for determination of $S_{12}$.

Often, the $S_{11}$ and $S_{12}$ measurements are sufficient to determine impedance, however, many test materials are anisotropic and the polarization of the received wave may vary based on the geometry and angles of incidence of the propagated waves. As such, rotation of the aperture plate 22 permits repeating the transmitting of an electromagnetic wave through the specimen at a different angle. As such, S-parameter measurements, $S_{11}$ and $S_{12}$, may be made as previously described at a first angle of incidence. At a second angle of incidence, the measurements are made once again. The four measurements may then be supplied to a network analyzer, which may use the measurements to determine loss characteristics such as impedance, complex permittivity, and complex permeability. While any angle of incidence may be chosen from which to perform these measurements, it is often mathematically advantageous to perform these measurements at incident angles of zero degrees and forty-five degrees. As such, an aperture plate 22 in the anechoic test chamber 10 permits adjustment to different angles with respect to the longitudinal axis L1 of the first and second conical section 12, 14, as previously described. For anisotropic materials, additional measurements may be made of the sample by propagating a second electromagnetic wave through the material specimen with a different polarization, recording both the $S_{11}$ and $S_{12}$ measurements for analysis by the analysis software.

For material samples that have magnetic properties, additional measurements to determine permeability and complex permeability are required. According to one embodiment, a reflective plate is placed over the aperture 23 while measuring the reflection of the electromagnetic wave from plate through the material specimen. The reflecting plate, therefore, is behind the sample. The reflection properties may then be compared to the properties of the through transmission measurement by the network analyzer and analysis software. In an alternative embodiment, the thickness of the material may be doubled, which therefore provides the same increase in thickness as the reflected measurement, and the through test repeated in the absence of a reflective plate. The measurements are then once again compared to the original through measurements by the network analyzer and analysis software. Doubling the thickness of the material, at least alters the thickness in a known manner simplifying the mathematical analysis of the material, however, the thickness of the material may be otherwise altered in a known manner without departing from the spirit or scope of the claims.

While material measurements have been described in conjunction with network analyzers and network analysis software that determine impedance, permittivity, permeability, complex permittivity, and complex permeability using S-parameters, it will be understood by those of ordinary skill in the art that other measurement systems utilizing other material analysis techniques may used in conjunction with these methods and the anechoic test chamber described herein. In fact, any electromagnetic wave analysis procedures that permit determinations of impedance, permittivity, permeability, complex permittivity, and complex permeability either via software or manually via Smith charts, or other methods, may be implemented in conjunction with the present invention without departing form the spirit or scope of the claims.

According to one embodiment of determining a loss characteristic of a material specimen, the network analyzer must be calibrated to the anechoic chamber. The direct path loss is calibrated by propagating an electromagnetic wave from the first antenna 16 through the aperture plate 22 and aperture 23 and measuring the loss at the second antenna 18. The reflected path loss is calibrated by inserting a flat reflective plate over the test aperture 23. The return of the electromagnetic wave from the aperture plate 22 is then measured at the first antenna 16. From the direct path and reflected measurements the characteristics of the anechoic test chamber may then be provided to the network analyzer and network analysis software so that the effects of the chamber may be eliminated from the final measurements. More specific calibration procedures will be provided by the specific analyzer and measurement system. For example, one embodiment uses the Agilent 8510 Network Analyzer, which requires specific calibration measurements and procedures as outlined in Agilent Product Note 8510-5B "Specifying Calibration Standards for the Agilent 8510 Network Analyzer," which is hereby incorporated by reference. As such, the above calibration procedure may be adapted for calibration purposes in conjunction with the calibration standards provided by the manufacturer.

As previously noted, there should be a high degree of electromagnetic isolation between the conical sections to obtain the greatest electromagnetic wave return, and this includes calibration measurements. For both calibration measurements, through and reflected, the intersection of the cylinder and the aperture plate is electromagnetically sealed with an electromagnetic attenuating material. When a reflective plate is placed over the aperture, the intersection between the reflective plate and aperture plate is also electromagnetically sealed with an electromagnetic attenuating material. In order to electromagnetically seal the intersections, sealing tape as previously described, may be used. Other absorbing materials may also be used to electromagnetically isolate the first and second conical sections 12, 14.

ONE EXAMPLE OF AN ANECHOIC TEST CHAMBER

One particular embodiment the anechoic test chamber 10, depicted in FIGS. 1 through 5, is large enough to accommodate a large range of test samples. The overall size is 7.5 ft. wide across the cylinder 20 at the longitudinal axis L2, 8.25 ft. in radius across the cylinder 20 at the longitudinal axis L1, and 24 ft long from the end of the first conical section 12 to the end of the second conical section 14. As such, large test samples may be tested without destruction in the test chamber 10, therefore preserving the material samples for use in production.

This design permits $S_{11}$ and $S_{12}$ measurements from 0.125 to 40 GHz in five bands. Sample sizes up to 4 ft. wide, 8+ ft. long, and 12 inches thick, can be tested in sections by sliding the sample into the test fixture. Apertures up to 46 inches square can be provided in the aperture plate 22. The angle of incidence can be adjusted from 0 degrees to 45 degrees by rotating the aperture plate 22 within the cylinder 20. The longitudinal axis of the first and second conical sections 12, 14 is at 15 degrees to horizontal, therefore, permitting a material specimen to gravitationally rest against the aperture plate 22.

Figure 8:
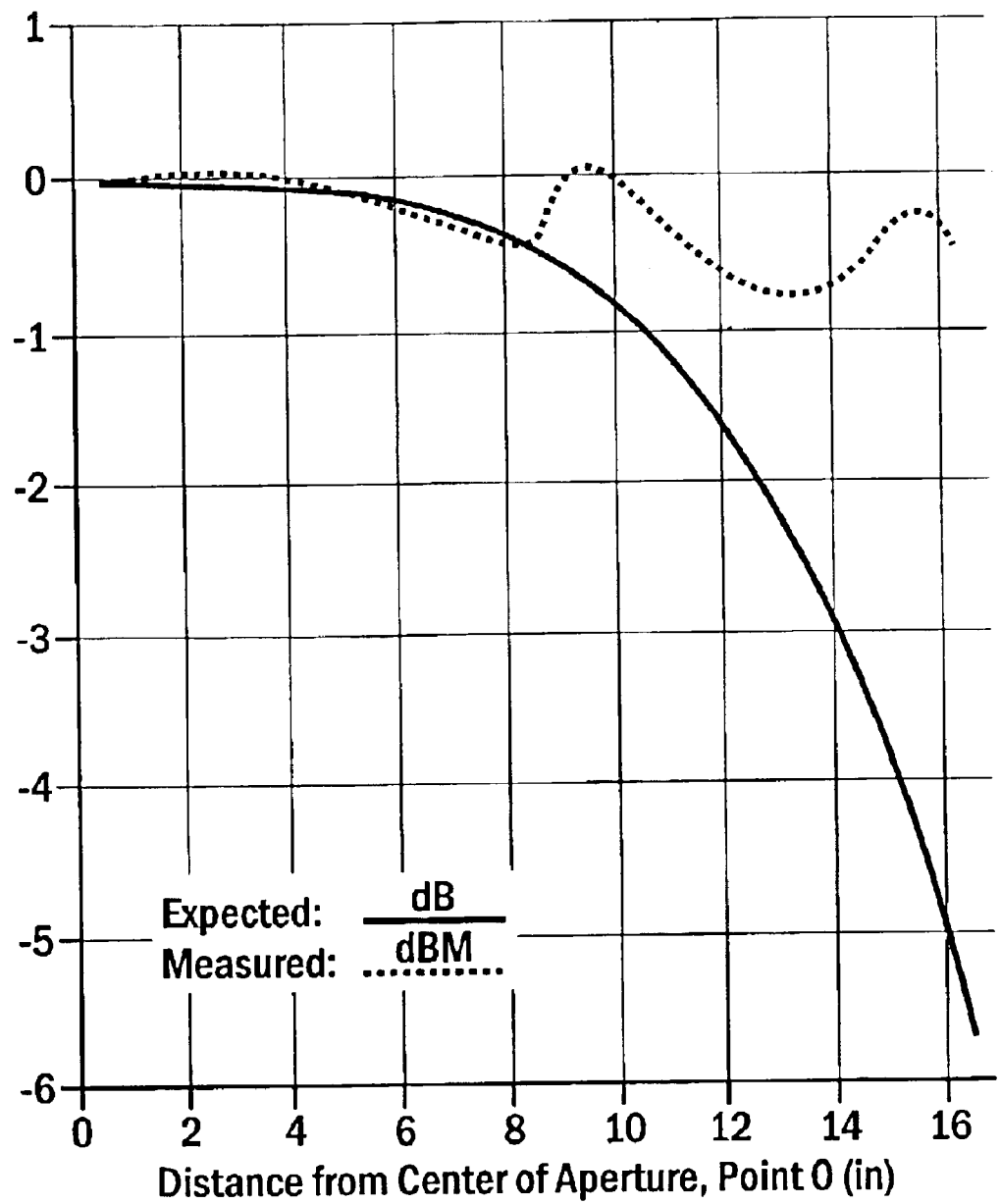
FIG. 8 is a graph illustrating the expected and measured field strength of an electromagnetic wave at points through one anechoic chamber according to an embodiment of the present invention.

The chamber 10 was field probed to determine the experimental field taper at the aperture, the results of which are shown in FIG. 8 in comparison to the calculated field. The dashed line represents the measured result and the solid line represents the expected result. The difference in the taper between the calculated and the measured field probes shows that the pattern of the source antennas was neglected in the calculations. The image antenna magnitudes are attenuated, thus broadening the pattern of the source array and providing a slower roll off in the measured field versus the calculated field. The results confirm that a relatively uniform field can be established over a large portion of the cross section of the aperture.

The system is capable of testing from 0.125 GHz to 40 GHz in a single test fixture using a variety of antennas. A broadband automatic network analyzer, an Agilent 8510 Network Analyzer, was used to measure S-parameters in the complex domain. Agilent 85071D Material Measurement Software was used to analyze the material measurements to determine loss parameters, including impedance, permittivity, permeability, complex permittivity, and complex permeability.

According to this example, the antennas used to feed the conical sections from 0.125 to 2.0 GHz are printed circuit flared notch antennas arranged so that both vertical and horizontal polarization can be selected. Conical quadridged horns are used from 2 to 18 GHz. Quadridged diagonal antennas are used from 18 to 40 GHz. The antennas are dual polarized so that you can provide an electromagnetic wave that is horizontal to the plane, horizontal to the ground or vertical with respect to the ground.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An anechoic test chamber for testing an electromagnetic loss characteristic of a material specimen, comprising:
   a first conical section defining a first longitudinal axis and having an anechoic material covering an inside surface;

a first antenna disposed within an end portion of the first conical section;

a second conical section having a second longitudinal axis collinear with the first longitudinal axis such that first and second conical sections taper inwardly and away from each other along the longitudinal axis, the second conical section having an anechoic material covering an inside surface;

a second antenna disposed within an end portion of the second conical section; and an aperture plate defining an aperture on the plate, the aperture plate being disposed between the first and second sections and having an electromagnetic impedance lower than that of the material specimen.

2. The anechoic test chamber according to claim 1, wherein the first antenna comprises a feed antenna.

3. The anechoic test chamber according to claim 2, wherein the first antenna also comprises a receive antenna.

4. The anechoic test chamber according to claim 1, wherein the second antenna comprises a receive antenna.

5. The anechoic test chamber according to claim 1, wherein the inside surface of the first conical section defines a cone having an intersection angle such that an electromagnetic wave reflected from the inside surface arrives at the aperture in phase with a direct path component of the electromagnetic wave.

6. The anechoic test chamber according to claim 5, wherein the intersection angle is dependent upon a predetermined wavelength of an electromagnetic wave transmitted from the feed antenna and a predetermined path length from the feed antenna to the aperture.

7. The anechoic test chamber according to claim 1, further comprising a cylindrical section having an anechoic material covering an inside surface, the cylindrical section being disposed between first and second sections for holding the aperture plate, the cylindrical section defining a third longitudinal axis that is perpendicular to the first and second longitudinal axes.

8. The anechoic test chamber according to claim 7, wherein the aperture plate is rotatable about the third longitudinal axis with respect to the first and second longitudinal axes.

9. The anechoic test chamber according to claim 7, wherein the first longitudinal axis is at an acute angle with respect to horizontal such that the cylinder and aperture plate permit the specimen to rest against the aperture plate.

10. The anechoic test chamber according to claim 1, further comprising an electromagnetic attenuating material for sealing between the specimen and the aperture plate, the electromagnetic attenuating material having an electromagnetic impedance lower than the material specimen.

11. The anechoic test chamber according to claim 10, wherein the electromagnetic attenuating material comprises a conductive electromagnetic sealing tape.

12. The anechoic test chamber according to claim 1, wherein the first and second conical sections comprise first and second modular cones capable of being removably connected to each other in a conical sequence.

13. The anechoic test chamber according to claim 1, wherein first and second antennas are selected from the group consisting of a printed circuit flared notch antenna, a conical quadridged horn antenna, and a quadridged diagonal antenna.

14. A method of determining a loss characteristic of a material specimen in a measurement system having an opposed dual conical anechoic test chamber with oppositely tapered first and second conical sections defining collinear longitudinal axes, an aperture plate therebetween, and feed and receive antennas; the method comprising:

calibrating the measurement system;

placing the specimen over the aperture at a first angle with respect to the longitudinal axes;

covering the intersection between the specimen and the aperture plate with an electromagnetic attenuating material;

transmitting a first electromagnetic wave from the first conical section through the specimen at a predetermined frequency and field intensity;

measuring the first electromagnetic wave in the second conical section; and determining a loss characteristic of the specimen based on the difference between the transmitted and measured electromagnetic wave.

15. The method according to claim 14, wherein the step of calibrating the measurement system comprises:

transmitting a first calibration electromagnetic wave from the first conical section at the predetermined frequency, magnitude, and polarization through the aperture plate;

measuring the first calibration wave in the second conical section;

determining a first calibration parameter based on a difference between transmitted and measured first electromagnetic wave;

covering the aperture in the aperture plate with an electromagnetically reflective material;

transmitting a second calibration electromagnetic wave from the first conical section at the predetermined frequency, magnitude, and polarization through the covered aperture plate;

measuring the second calibration wave in the first conical section; and determining a second calibration parameter based on a difference between the transmitted and measured second electromagnetic wave.

16. The method according to claim 14, wherein the step of filling comprises filling the freespace between the specimen and the aperture plate with an electromagnetic attenuating tape.

17. The method according to claim 14, wherein the step of transmitting further comprises transmitting the electromagnetic wave at a first polarization.

18. The method according to claim 17, further comprising rotating the specimen to a second angle with respect to the longitudinal axes and then repeating the transmitting, measuring, and determining steps.

19. The method according to claim 18, wherein the step of rotating the specimen comprises rotating the aperture plate.

20. The method according to claim 17, further comprising transmitting an electromagnetic wave at the predetermined frequency and field intensity and a second polarization, and then repeating the transmitting, measuring, and determining steps.

21. The method according to claim 17, further comprising altering the thickness of the material specimen and then repeating the transmitting, measuring, and determining steps.

22. The method according to claim 21, wherein the step of altering the thickness of the specimen comprises doubling the thickness of the material specimen.

23. The method according to claim 17, further comprising covering the aperture in the aperture plate with an electromagnetically reflective material such that the specimen lies between the reflective material and the feed antenna, and then repeating the transmitting step, measuring the reflected electromagnetic wave in the first conical section, and repeating the determining step.

24. The method according to claim 17, wherein the step of determining the loss parameter determines a loss parameter selected from the group consisting of impedance, permittivity, permeability, complex permittivity, and complex permeability.

25. The method according to claim 17, wherein the step of determining the loss parameter comprises determining loss parameters utilizing S-parameter electromagnetic wave propagation analysis.

* * * * *